(12) United States Patent
Jin et al.

(10) Patent No.: US 7,719,185 B2
(45) Date of Patent: *May 18, 2010

(54) FLAT PANEL DISPLAY AND DRIVING METHOD USING THE SAME

(75) Inventors: Dong-Un Jin, Yongin-si (KR); Jae-Kyeong Jeong, Yongin-si (KR); Hyun-Soo Shin, Yongin-si (KR); Yeon-Gon Mo, Yongin-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 618 days.

This patent is subject to a terminal disclaimer.

(21) Appl. No.: 11/604,285

(22) Filed: Nov. 27, 2006

(65) Prior Publication Data

US 2007/0138941 A1    Jun. 21, 2007

(30) Foreign Application Priority Data

Dec. 21, 2005    (KR) .................. 10-2005-0127223

(51) Int. Cl.
*H01J 63/04*    (2006.01)
(52) U.S. Cl. ..................................... 313/506
(58) Field of Classification Search .......... 313/506; 445/24–25
See application file for complete search history.

(56) References Cited

U.S. PATENT DOCUMENTS

| | | | |
|---|---|---|---|
| 6,122,079 A * | 9/2000 | Branca et al. .............. 359/15 |
| 6,140,987 A * | 10/2000 | Stein et al. .................. 345/87 |
| 6,727,522 B1 | 4/2004 | Kawasaki et al. | |
| 6,911,960 B1 * | 6/2005 | Yokoyama ................. 345/76 |
| 2004/0155846 A1 * | 8/2004 | Hoffman et al. ............. 345/87 |
| 2005/0253789 A1 * | 11/2005 | Ikeda ......................... 345/76 |

FOREIGN PATENT DOCUMENTS

CN    1534367    10/2004

(Continued)

OTHER PUBLICATIONS

European Search Report corresponding to European Patent Application No. 06126776.1-1235, issued on Apr. 18, 2007.

(Continued)

*Primary Examiner*—Joseph L Williams
*Assistant Examiner*—Hana A Sanei
(74) *Attorney, Agent, or Firm*—Robert E. Bushnell, Esq.

(57) ABSTRACT

An organic light emitting display (OLED), which includes a display unit and a controlling unit, is provided. The display unit includes an organic light emission layer and a transparent thin film transistor (TFT) to drive the organic light emission layer, and the display unit emits light into two opposite surfaces (upper and lower surfaces). The controlling unit includes an electro-optical layer that is capable of being switched from one state to another state by applying voltage to the layer. The controlling unit controls transmission of light emitted from the display unit. Therefore the flat panel display of the present invention is capable of displaying an image in one surface or in two surfaces. The selection of surface of image display can be manually or automatically controlled by a user. The controlling unit can includes a liquid crystal device, an electrophoretic device, or an electrochromic device.

16 Claims, 4 Drawing Sheets

FOREIGN PATENT DOCUMENTS

| | | |
|---|---|---|
| CN | 1591523 | 3/2005 |
| EP | 1 510 994 | 3/2005 |
| EP | 1 515 181 | 3/2005 |
| JP | 2003-029293 | 1/2003 |
| JP | 2004-014982 | 1/2004 |
| JP | 2004-199033 | 7/2004 |
| JP | 2005-070074 | 3/2005 |
| KR | 10-2005-0112920 | 12/2005 |
| WO | WO 03/048849 | 6/2003 |
| WO | WO 03/067014 | 8/2003 |
| WO | 2005/088594 | 9/2005 |

OTHER PUBLICATIONS

*Office Action* from the SIPO issued in Applicant's corresponding Chinese Patent Application No. 200610168546.3 dated Aug. 1, 2008.

Korean Office Action for Korean Patent Application No. 2005-0127223 issued on Jan. 23, 2007.

Office action from Japanese Patent Office issued in Applicant's corresponding Japanese Patent Application No. 2006-293175 dated Apr. 14, 2009 and the Request for Entry of the Accompanying Office Action.

\* cited by examiner

FLAT PANEL DISPLAY AND DRIVING METHOD USING THE SAME

CLAIM OF PRIORITY

This application makes reference to, incorporates the same herein, and claims all benefits accruing under 35 U.S.C. §119 from an application for FLAT PANEL DISPLAY AND DRIVING METHOD USING THE SAME earlier filed in the Korean Intellectual Property Office on 21 Dec. 2005 and there duly assigned Serial No. 2005-127223.

BACKGROUND OF THE INVENTION

1. Field of the Invention

The present invention relates to an organic light emitting display, and more particularly, to an organic light emitting display that is capable of displaying an image in one surface (an upper surface) or in two surfaces (an upper and a lower surfaces). The surface of image display can be selected by a user, and can be selected for a time period set by a user. The organic light emitting display of the present invention has a controlling unit that changes between an opaque state and a transparent state, and the controlling unit controls transmission of light to display an image on one surface or on two opposite surfaces of the organic light emitting display.

2. Description of the Related Art

Demands on personal computers (PC), car navigation systems, personal digital assistants, information communication devices, and combined products of the above have recently increased with the advent of an information oriented society. The above-described products require characteristics of high visibility, a wide view angle, and a high response speed to display moving images. A flat panel display (FPD) is suitable for the above characteristics so that the FPD has been attracted as a next generation display.

In general, a thin film transistor (TFT) has widely been used as a switching device that operates each pixel in a display device such as an organic light emitting display (OLED) or a liquid crystal display (LCD), etc. Therefore, significant attention is paid to fabrication of the TFT, and a FPD using more effective TFTs and a method of driving the FPD have been proposed.

A thin film transistor includes a semiconductor layer, a gate electrode, a source electrode, and a drain electrode. In general, the semiconductor layer, the gate electrode, the source electrode, and the drain electrode are made of opaque materials. In particular, the semiconductor layer is made of amorphous silicon or polysilicon. Because these materials are not transparent, there is limitation on increasing a width of a channel of the TFT when these opaque materials are used to manufacture a TFT that is used as a switching device of a transparent organic light emitting display. Because the width of channel is narrow, a large amount of current cannot flow into the channel, and a high voltage must be applied to the TFT. Therefore, there has problems that the light emitting device of the transparent organic light emitting display deteriorates and power consumption increases. Also, it is not possible to display an image on both surfaces of the organic light emitting display, because an amount of light passing through the opaque TFT is blocked by the TFT.

SUMMARY OF THE INVENTION

In order to achieve the foregoing objects of the present invention, according to one aspect of the present invention, there is provided an organic light emitting display (OLED) including a first transparent substrate, an emission layer arranged above an upper surface of the first transparent substrate, a transparent thin film transistor arranged on the upper surface of the first transparent substrate for driving the emission layer, a first transparent electrode arranged on a lower surface of the first transparent substrate, a second transparent substrate arranged below the lower surface of the first transparent electrode, and a light shielding layer arranged between the first transparent electrode and the second transparent substrate.

The light shielding layer is capable of being switched to a first state whenever a first voltage is applied to the first transparent electrode and capable of being switched to a second state whenever a second voltage is applied to the first transparent electrode. An amount of light passing the light shielding layer at the first state is different from an amount of light passing the light shielding layer at the second state.

The organic light emitting display can include a second transparent electrode arranged between the light shielding layer and the second transparent substrate, and the light shielding layer can be a polymer dispersed liquid crystal, twisted nematic liquid crystal layer, and an electrochromic layer.

The organic light emitting display can include a side electrode arranged on a side of the light shielding layer, and the light shielding layer can be an electrophoretic layer.

The organic light emitting display can include a driving unit for applying a voltage to the first transparent electrode layer, and the driving unit can be manually controlled or automatically controlled by a photosensing.

The transparent thin film transistor can include a transparent semiconductor layer, a transparent gate electrode, a transparent source electrode, and a transparent drain electrode. Each of the transparent gate electrode, the transparent source electrode, and the transparent drain electrode is made of a material such as indium tin oxide (ITO), indium zinc oxide (IZO), or indium tin zinc oxide (ITZO). The transparent semiconductor layer is formed of a wide band semiconductor substance whose band gap is at least 3.0 eV. The wide band semiconductor substances are formed of a material such as zinc oxide (ZnO), zinc tin oxide (ZnSnO), cadmium tin oxide (CdSnO), gallium tin oxide (GaSnO), thallium tin oxide (TlSnO), indium gallium zinc oxide (InGaZnO), copper aluminum oxide (CuAlO), strontium copper oxide (SrCuO), layered oxychalcogenide (LaCuOS), gallium nitride (GaN), indium gallium nitride (InGaN), aluminum gallium nitride (AlGaN), indium gallium aluminum nitride (InGaAlN), silicon carbide (SiC), or diamond.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, a flat panel display (FPD) and a method of driving the same according to preferred embodiments of the present invention will be described with reference to the attached drawings.

According to the present invention, in order to simplify description, the word 'transparent' comprises the meaning of 'transparent or transmissive'. Also, according to the present invention, for convenience sake, a term of controlling unit, which is connected to an emission panel that includes an organic light emitting display (OLED), is used to refer to a device that is capable of control of light transmission. The controlling unit can be a liquid crystal display (LCD), a field emission display (FED), a plasma display panel (PDP), an electro luminescent display (ELD), or a vacuum fluorescent display (VFD).

Figure 1:
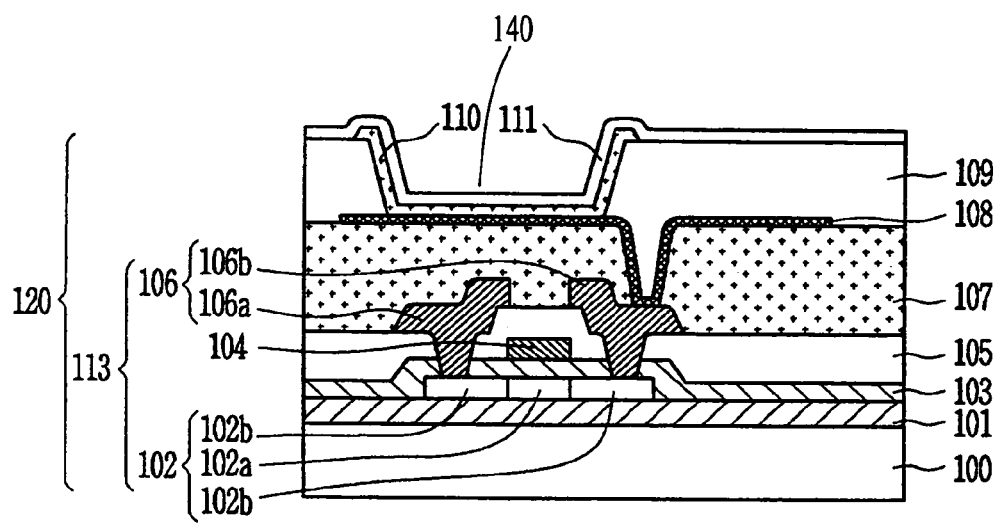
FIG. 1 is a schematic sectional view illustrating an organic light emitting display (OLED)

FIG. 1 is a schematic sectional view of an organic light emitting display that includes a thin film transistor 113. Referring to FIG. 1, organic light emitting display 120 includes substrate 100, buffer layer 101 formed on substrate 100, semiconductor layer 102 configured of active layer 102a and ohmic contact layers 102b formed on a region of buffer layer 101, and gate insulating layer 103 formed on buffer layer 101 and semiconductor layer 102. Gate electrode 104 is formed on gate insulating layer 103 and above semiconductor layer 102. Interlayer insulating layer 105 is formed on the gate electrode 104. Electrode 106 includes source electrode 106a and drain electrode 106b, and is formed on a region of interlayer insulating layer 105, and are connected to ohmic contact layers 102b through cavities formed in gate insulating layer 103 and interlayer insulating layer 105. Planarization layer 107 is formed on source and drain electrodes 106a and 106b. First electrode layer 108 is formed on a region of planarization layer 107, and is connected to drain electrode 106b through a groove of planarization layer 107. Pixel defining layer 109 is formed on first electrode layer 108 and planarization layer 107. Pixel defining layer 109 has an aperture 140 to expose at least a region of first electrode layer 108. Emission layer 110 is formed inside aperture 140, and second electrode layer 111 is formed on emission layer 110 and pixel defining layer 109.

Figure 2:
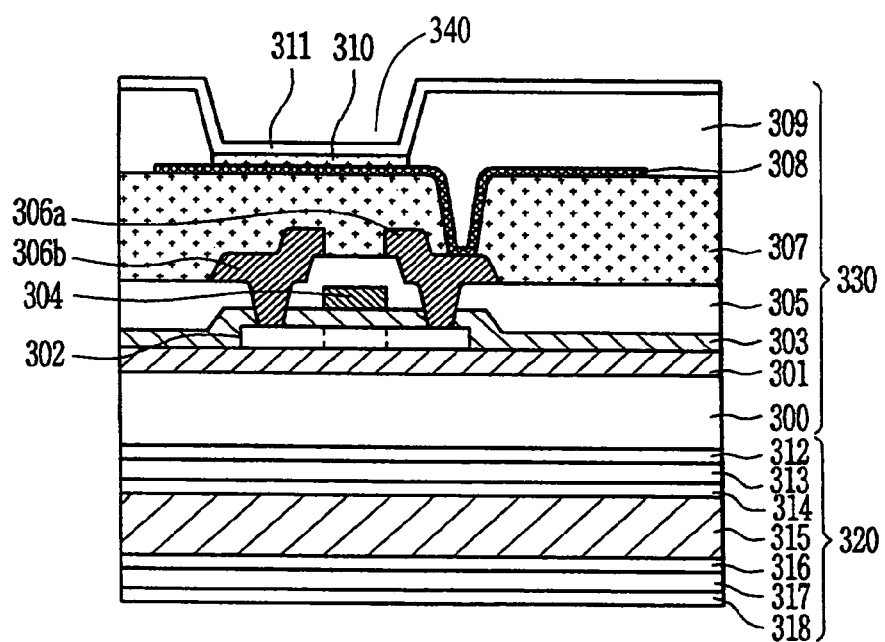
FIG. 2 is a schematic sectional view illustrating an organic light emitting display constructed as a first embodiment of the present invention.

FIG. 2 is a schematic sectional view illustrating an organic light emitting display constructed as a first embodiment of the present invention. Referring to FIG. 2, the organic light emitting display includes display unit 330 that includes at least one organic light emitting diode and a thin film transistor formed on first transparent substrate 300, and controlling unit 320 formed on the lower portion of display unit 330 to control transmission of light emitted from display unit 330.

Hereinafter, controlling unit 320 will be described in detail. First substrate 313 and second substrate 317 of controlling unit 320 are arranged in a manner that an inner surface of first substrate 313 and an inner surface of second substrate 317 face each other. First transparent electrode 314 and second transparent electrode 316 are formed in the inner surfaces of first substrate 313 and second substrate 317, respectively. Liquid crystal layer 315, which is a light shielding layer, is interposed between first transparent electrode 314 and second transparent electrode 316. First polarizing plate 312 and second polarizing plate 318 are positioned in outer surfaces of first substrate 313 and second substrate 317, respectively.

Controlling unit 320 further comprises a driving unit (not shown) to apply voltage to first transparent electrode 314 and second transparent electrode 316. The driving unit (not shown) can be manually driven, or can be automatically controlled being coupled to a photosensing device.

Liquid crystal layer 315 can block or transmit light, as the voltage from the driving unit (not shown) is applied between first transparent electrode 314 and second transparent electrode 316. For example, when liquid crystal layer 315 of controlling unit 320 is a twisted nematic (TN) liquid crystal layer, alignment of liquid crystal molecules in liquid crystal layer 315 changes depending on magnitude of voltage, which is supplied from the driving unit and is applied between first transparent electrode 314 and second transparent electrode 316. In other words, liquid crystal molecules in liquid crystal layer 315 becomes 90° twisted on a plane parallel to the first or second substrate when voltage is off, and liquid crystal molecules in liquid crystal layer 315 is vertically aligned to the first or second substrate when voltage is on.

Accordingly, when voltage is off(or at a first voltage), only a first linear polarization of light, whose polarization direction is parallel to a polarization axis of first polarizing plate 312, passes through first polarizing plate 312. The first linear polarization passes through the 90° twisted liquid crystal layer 315, and the polarization direction of the first linear polarization rotates by 90°, which becomes a second linear polarization whose polarization direction is parallel to a polarization axis of second polarizing plate 318. Therefore, the second linear polarization, which is transformed from the first linear polarization while passing liquid crystal layer 315, passes through second polarizing plate 318. In this case, the screen of controlling unit 320 becomes white or a bright state (or a first state).

When voltage is on (or at a second voltage), only a first linear polarization of light, whose polarization direction is parallel to a polarization axis of first polarizing plate 312, passes through first polarizing plate 312. Because liquid crystal molecules of liquid crystal layer 315 are vertically aligned due to the applied voltage, the first linear polarization is not transformed to a second linear polarization when the first linear polarization passes through liquid crystal layer 315. Therefore, the first linear polarization, which is transmitted through liquid crystal layer 315, is blocked by second polarizing plate 318, because only a second linear polarization can pass second polarizing plate 318. The screen of controlling unit 320 becomes black or a dark state (or a second state).

The above example shows switching mechanism between a black state and a white state, but controlling unit 320 can display gray states between the black and white states by controlling magnitude of voltage applied between first transparent electrode 314 and second transparent electrode 316 of controlling unit 320. Degree of revolution (or transformation) of a first linear polarization depends on the degree of the twist, and degree of twist of liquid crystal molecules depends on the magnitude of the voltage. Therefore, degree of transformation of the first linear polarization is controlled by the voltage, and accordingly the light intensity transmitted through controlling unit 320 is controlled by the voltage.

In the first embodiment, twisted nematic liquid crystal layer is described as an example of a light shielding layer. The layer interposed between first transparent electrode 314 and second transparent electrode 316, however, are not limited to the twisted nematic liquid crystal layer. Any electro-optical layer capable of being switched from one state to another state by applying voltage between first transparent electrode 314 and second transparent electrode 316 can be used.

A layer satisfying the requirement described above includes a structure such as a polymer dispersed liquid crystal (PDLC). If no voltage is applied to a PDLC, liquid crystal molecules in the PDLC are arranged in random directions to cause scattering of light at an interface that has a different refractive index from that of a medium. If voltage is applied to the PDLC, liquid crystal molecules of the PDLC is uniformly arranged in one direction, and light can transmit through the PDLC. Therefore, light can be shielded or transmitted by selectively applying voltage between first transparent electrode 314 and second transparent electrode 316

Hereinafter, the display unit 330 will be described in more detail. Display unit 330 includes first transparent substrate 300, buffer layer 301 formed on first transparent substrate 300, transparent semiconductor layer 302 formed on buffer layer 301 in a predetermined pattern, gate insulating layer 303 formed on transparent semiconductor layer 302, gate electrode 304 formed on gate insulating layer 303 and patterned to correspond to the pattern of transparent semiconductor layer 302, interlayer insulating layer 305 formed on gate electrode 304, and planarization layer 307 formed on source and drain electrodes 306a and 306b. Source and drain electrodes 306a and 306b are electrically connected to transparent semiconductor layer 302 via a contact hole formed on gate insulating layer 303 and interlayer insulating layer 305. Display unit 330 also includes third electrode layer 308 formed on a region of planarization layer 307 and connected to either source electrode 306a or drain electrode 306b, pixel defining film 309 formed on third electrode layer 308 and having an aperture 340 that partially exposes third electrode layer 308, emission layer 310 formed on a region of the pixel defining film 309 and inside aperture 340, and fourth electrode layer 311 formed the upper portion of emission layer 310.

First transparent substrate 300, for example, can be made of an insulating material such as glass, plastic, sapphire, silicon, or synthetic resins, etc. It is preferable that first transparent substrate 300 is formed in a form of flexible thin film.

Buffer layer 301 is formed on first transparent substrate 300. Buffer layer 301 is formed of a nitride film, an oxide film, or a film made of transparent insulating materials, etc., but is not limited thereto.

Semiconductor layer 302 is formed of a semiconductor substance that has a wide band gap. It is preferred that band gap of the semiconductor substance is 3.0 eV or more and the semiconductor substance is transparent. For example, semiconductor layer 302 can be made of an oxide material such as zinc oxide (ZnO), zinc tin oxide (ZnSnO), cadmium tin oxide (CdSnO), gallium tin oxide (GaSnO), thallium tin oxide (TlSnO), indium gallium zinc oxide (InGaZnO), copper aluminum oxide (CuAlO), strontium copper oxide (SrCuO), layered oxychalcogenide (LaCuOS), a nitride material such as gallium nitride (GaN), indium gallium nitride (InGaN), aluminum gallium nitride (AlGaN), or indium gallium aluminum nitride (InGaAlN), or a carbide material such as silicon carbide (SiC) or diamond, etc.

Gate insulating layer 303 is formed on semiconductor layer 302, and provides insulation between semiconductor layer 302 and gate electrode 304. Gate insulating layer 303 is formed of an oxide film, a nitride film, a film made of transparent insulating materials, etc., but is not limited thereto.

Gate electrode 304 is formed on gate insulating layer 303, and is formed over a portion of the channel region (not shown) of transparent semiconductor layer 302 in a predetermined pattern. Gate electrode 304 and source and drain electrodes 306a and 306b are made of materials having high conductivity and transparency such as indium tin oxide (ITO), indium zinc oxide (IZO), indium tin zinc oxide (ITZO), translucent metals, etc., but are not limited thereto.

Interlayer insulating layer 305 is formed on gate electrode 304 and gate insulating layer 303. Interlayer insulating layer 305 is made of the same substance as the substance of gate insulating layer 303.

Source and drain electrodes 306 and 306b are formed on interlayer insulating layer 305 in a manner that each of source and drain electrodes 306a and 306b is electrically connected to each side of transparent semiconductor layer 302, respectively, through a contact hole formed on gate insulating layer 303 and interlayer insulating layer 305 as shown in FIG. 2. Here, source and drain electrodes 306a and 306 are made of the same substances as the substance of gate electrode 304.

Planarization layer 307 is formed on source and drain electrodes 306a and 306b and interlayer insulating layer 305, and is formed of a nitride film, an oxide film, a film made of transparent insulating materials, etc., but is not limited thereto. A via-hole is formed by etching a portion of planarization layer 307. Third electrode layer 308 is electrically connected to either source electrode 306a or drain electrode 306b through the via-hole formed on planarization layer 307.

Pixel defining film 309 is formed on third electrode layer 308 and planarization layer 307. Pixel defining film 309 has aperture 340 that partially exposes third electrode layer 308. Emission layer 310 is formed inside aperture 340, and can further include some of a hole injecting layer, a hole transporting layer, an electron injecting layer, and an electron transporting layer. Emission layer 310 emits light when holes and electrons injected from third electrode layer 308 and fourth electrode layer 311 are combined.

Fourth electrode layer 311 is formed on emission layer 310 and pixel defining film 309. Third electrode layer 308 and the fourth electrode layer 311 are made of the same substances as the substance of gate electrode 304.

Figure 3:
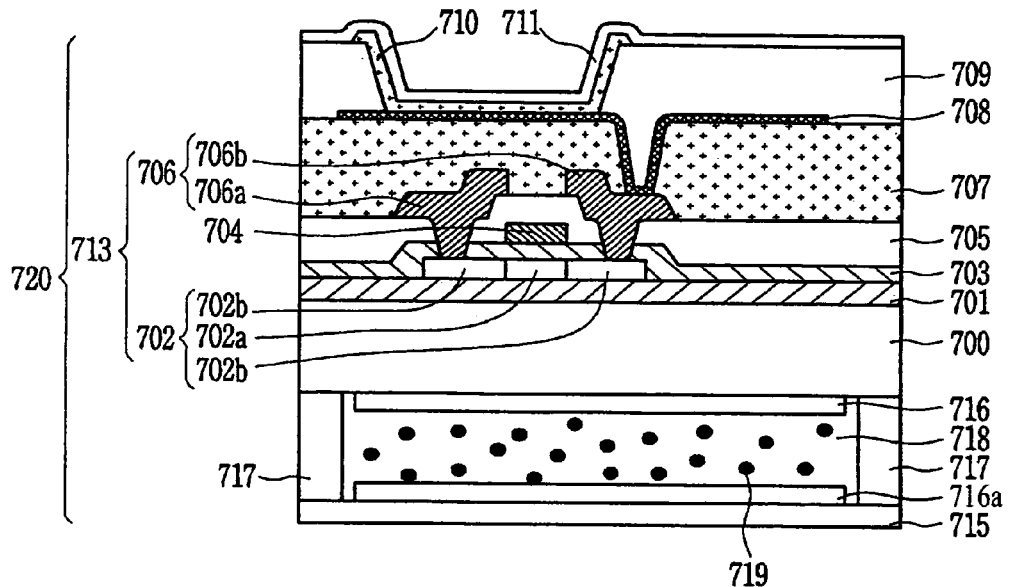
FIG. 3 is a schematic sectional view illustrating an organic light emitting display constructed as a second embodiment of the present invention.

FIG. 3 is a schematic sectional view illustrating an organic light emitting display constructed as a second embodiment of the present invention. As shown in FIG. 3, at least one transparent thin film transistor 713 and a structure including emission layer 710 are formed on the upper surface of first transparent substrate 700 of organic light emitting display 720. An electrophoretic device, which is a controlling unit, is formed at the lower surface of first transparent substrate 700.

Transparent thin film transistor 713 includes semiconductor layer 702, gate electrode 704, and electrode 706. Semiconductor layer 702 includes active layer 702a and ohmic contact layers 702b, and electrode 706 includes source electrode 706a and drain electrode 706b. The structure of transparent thin film transistor 713 is the same as described referring to FIG. 2, and detailed description of transparent thin film transistor 713 will be omitted.

The electrophoretic device is a non-emission type display device, which is operated by an electrophoretic phenomenon. According to the electrophoretic phenomenon, when an electric field is applied to a solution that has charged particles dispersed in a solvent, the charged particles migrates in the solution by Coulomb force. When particles in the form of capsules are dispersed in a solution and an electric shock is applied to the solution, the particles move in the solution to perform an electrical display.

The electrophoretic device formed at the lower surface of substrate 700 includes second transparent substrate 715 that is separated from first transparent substrate 700 by a predetermined distance and faces first transparent substrate 700. Herein, the surfaces of first transparent substrate 700 and second transparent substrate 715 that face each other are defined as inner surfaces of first transparent substrate 700 and second transparent substrate 715. The electrophoretic device also includes a layer of solvent 718 and charged particles 719, which form an electrophoretic layer that is also referred to as a light shielding layer. As shown in FIG. 3, first transparent electrodes 716 is formed on the inner surface of first transparent substrate 700, and second transparent substrate 716a is formed on the inner surface of second transparent substrate 715. Side electrode 717 is formed at a side of the electrophoretic layer as shown in FIG. 3. Side electrode 717 can be formed at an edge of first transparent substrate 700 and second transparent substrate 715, and an upper end of side electrode 717 can contact first transparent substrate 700, and an lower end of side electrode can contact second transparent substrate 715. Herein, relative location of element is described as upper surface (or top), lower surface (or bottom), or side surface (or side) with respect to an object. Side or side surface is defined as a surface of an object that is not the upper surface or the lower surface.

Solvent 718, into which charged particles 719 are dispersed, is injected into the space formed between first transparent substrate 714 and second transparent substrate 715. Solvent 718 together with charged particles 719 serves as a light shielding layer. As shown in FIG. 3, side electrode 717 is formed on a side of the shielding layer, and can partially or entirely enclose the space (or the light shielding layer) formed between first transparent substrate 700 and second transparent substrate 715.

First transparent electrode 716 can be formed on the entire inner surface of first transparent substrate 700 or can be divided into a plurality of sub-electrodes. Second transparent electrode 716a also can be formed on the entire inner surface of second transparent substrate 715, or can be divided into a plurality of sub-electrodes.

In this embodiment of the present invention, it is also possible that one of first transparent electrode 716 and second transparent electrode 716a can be formed, because basic switching operation of electrophoretic device of the present invention can be achieved whenever voltage is applied to side electrode 717 or one of first transparent electrode 716 and second transparent electrode 716a. In this embodiment, a pair of side electrodes 717 is illustrated to be formed at both sides of the electrophoretic layer, but also can be formed on one side of the electrophoretic layer. Although not shown in the drawing, spacers can be further provided outside side electrodes 717 to maintain a predetermined distance between first transparent substrate 700 and second transparent substrate 715.

Solvent 718 is filled into a space formed between first transparent substrate 700 and second transparent substrate 715, and at least one charged particle 719 is dispersed into solvent 718. Charged particles 719 can have black color, and are made of materials having excellent charged characteristic in positive polarity or negative polarity inside solvent 718. For example, charged particles 719 are made of inorganic pigment, organic pigment, carbon black, or resin containing material. The solvent has insulation property to prevent reaction with the charged particles and is made of a transparent non-polar solvent such as isoparaffin, silicon oil, xylene, or toluene.

A charge control agent for controlling charge of charged particles 719 and stabilizing the charge of charged particles 719 may be added to solvent 718 or charged particles 719. Succinimide, metal complex of monoazo dye, salicylic acid, organic silicon quaternary ammonium salt, or nigrosine compound can be used as the charge control agent. A dispersion agent for preventing cohesion of charged particles 719 can be further added to solvent 718. The dispersion agent make charged particles 719 stay in dispersed state. Polyvalent metal salt phosphate such as calcium phosphate and magnesium phosphate, carbonate such as calcium carbonate, inorganic salt, inorganic oxide, or organic polymer material can be used as the dispersion agent.

There are no limitations on combination ratio of the solvent to the charged particles. However, the solvent and the charged particles are preferably combined with each other at the same volume ratio in order to prevent the charged particles from sinking due to gravity.

A driving unit (not shown) for applying a voltage to first transparent electrode 716 (and/or second electrode 716a) or side electrode 717 is included so that the voltage is selectively applied to first transparent electrode 716 or side electrode 717 by a switch provided in a system of the driving unit. The thickness of the electrophoretic device, which is defined as a gap between first transparent substrate 700 and second transparent substrate 715, is 50 μm to 500 μm.

Solvent 718 together with charged particles 719 serves as a light shielding layer for blocking or transmitting light, depending on the voltage applied to first transparent electrode 716 (and/or second transparent electrode 716a) or applied to side electrode 717. Substances interposed between first transparent electrode 716 and side electrode 717 are not limited to solvent 718 and charged particles 719, but any substances capable of being switched by applying voltage to first transparent electrode 716 or side electrode 717 can be used.

Figure 4:
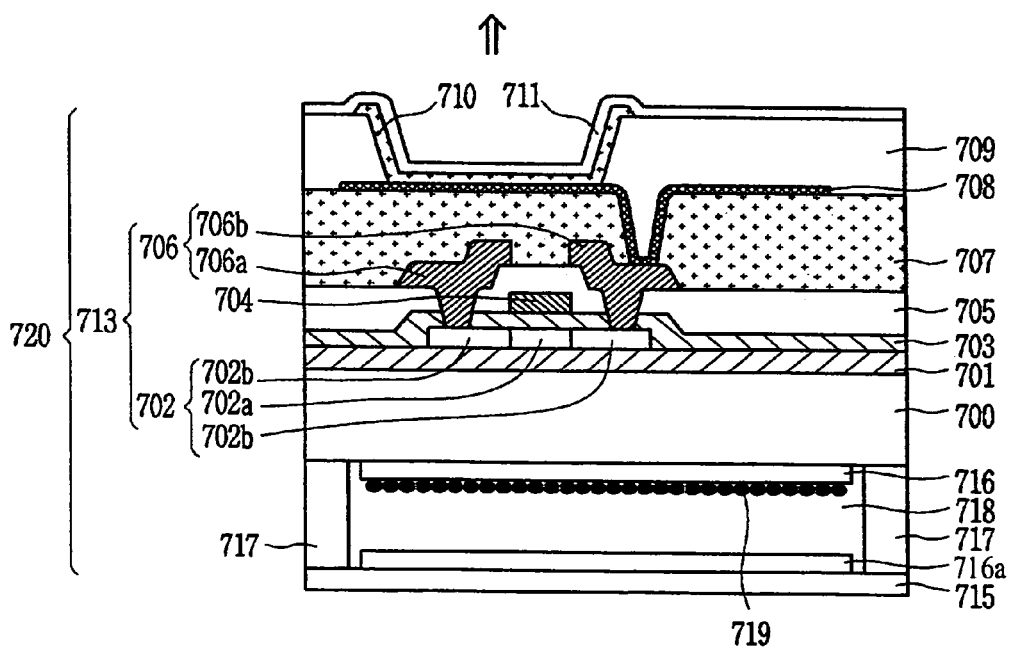
FIG. 4 is a schematic sectional view illustrating a state when voltage is applied to a first transparent electrode in the second embodiment of the present invention.
Figure 5:
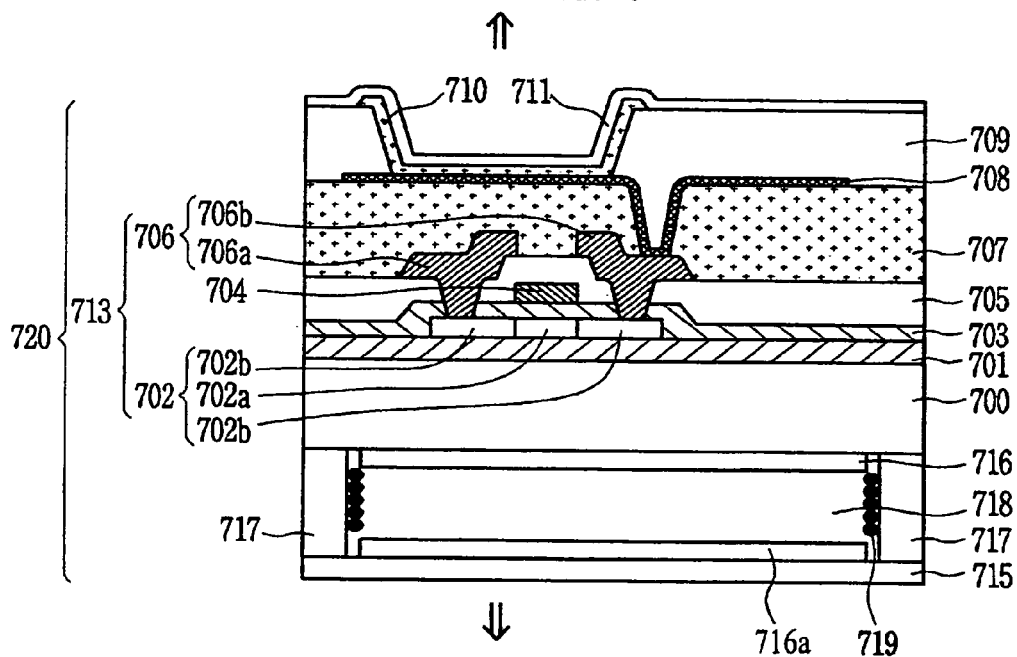
FIG. 5 is a schematic sectional view illustrating a state when voltage is applied to a side electrode in the second embodiment of the present invention.

FIGS. 4 and 5 are schematic sectional views illustrating a method of driving the OLED illustrated in FIG. 3. For convenience sake, detailed description of the same elements as those of FIG. 3 will be omitted. In particular, detailed description of the transparent thin film transistor (TFT) formed on the substrate and the material of the transparent TFT will be omitted.

FIG. 4 is a schematic sectional view illustrating a state that a voltage is applied to first transparent electrode 716 of the second embodiment of the present invention. Referring to FIG. 4, when charged particles 719 have positive (+) charges, a negative (−) voltage is applied to first transparent electrode 716. When negative (−) voltage is applied to first transparent electrode 716 formed on the inner surface of first transparent substrate 700, charged particles 719 having positive (+) charges migrate toward first transparent electrode 716, to which negative (−) voltage is applied, and are arranged near first transparent electrode 716 as shown in FIG. 4. Emission layer 710 emits light to both of upper and lower directions. When charged particles 719 uniformly adhere to first transparent electrode 716, the electrophoretic layer of OLED 720 operates as a black matrix, because charged particles 719 are black. Therefore, OLED 720 of the present invention emits light only toward upper direction as indicated with an arrow shown in FIG. 4, and emission toward lower direction is blocked by black charged particles 719.

When charged particles 719 have negative (−) charges, a positive (+) voltage is applied to first transparent electrode 716. When a positive (+) voltage is applied to first transparent electrode 716, charged particles 719 having negative (−) charges are adsorbed to first transparent electrode 716. Since charged particles 719 are black, the electrophoretic layer of OLED 720 operates as a black matrix, and therefore OLED 720 of the present invention emits light toward upper direction as indicated with an arrow shown in FIG. 4.

FIG. 5 is a schematic sectional view illustrating a state that a voltage is applied to side electrode 717 of the second embodiment of the present invention. Referring to FIG. 5, when charged particles 719 have positive (+) charges, negative (−) voltage is applied to side electrodes 717 that are formed on the side of the light shielding layer of the electrophoretic device in a form of barrier ribs that contact first transparent substrate 700 and second transparent substrate 715. Since negative (−) voltage is applied to side electrode 717, charged particles 719 having positive (+) charges are adsorbed to side electrodes 717. Therefore, the electrophoretic layer of OLED 720 of the present invention becomes transparent and light emitted from emission layer 710 transmits through both of upper and lower directions, as indicated with arrows shown in FIG. 5.

Herein, the state where the electrophoretic layer of OLED 720 operates as a black matrix can be referred to as a first state, and the state where the electrophoretic layer becomes transparent can be referred to as a second state. therefore, voltage (a first voltage) applied to first transparent electrode 716 at the first state is different from voltage (a second voltage) applied to first transparent electrode 716 at the second state.

When charged particles 719 have negative (−) charges, positive (+) voltage is applied to side electrodes 717. Since positive (+) voltage is applied to side electrode 717, charged particles 719 having negative (−) charges are adsorbed to side electrodes 717. Therefore, the electrophoretic layer of OLED 720 of the present invention becomes transparent and light emitted from emission layer 710 transmits to both of upper and lower directions, as indicated with arrows in FIG. 5.

According to the flat panel display of the present invention, a user can control the voltage applied to the first transparent electrode or to the side electrode. Therefore, it is possible to control display of images in one direction (upper direction) or in two opposite directions (upper and lower directions) at any time when the user decides the switching is necessary.

Figure 6:
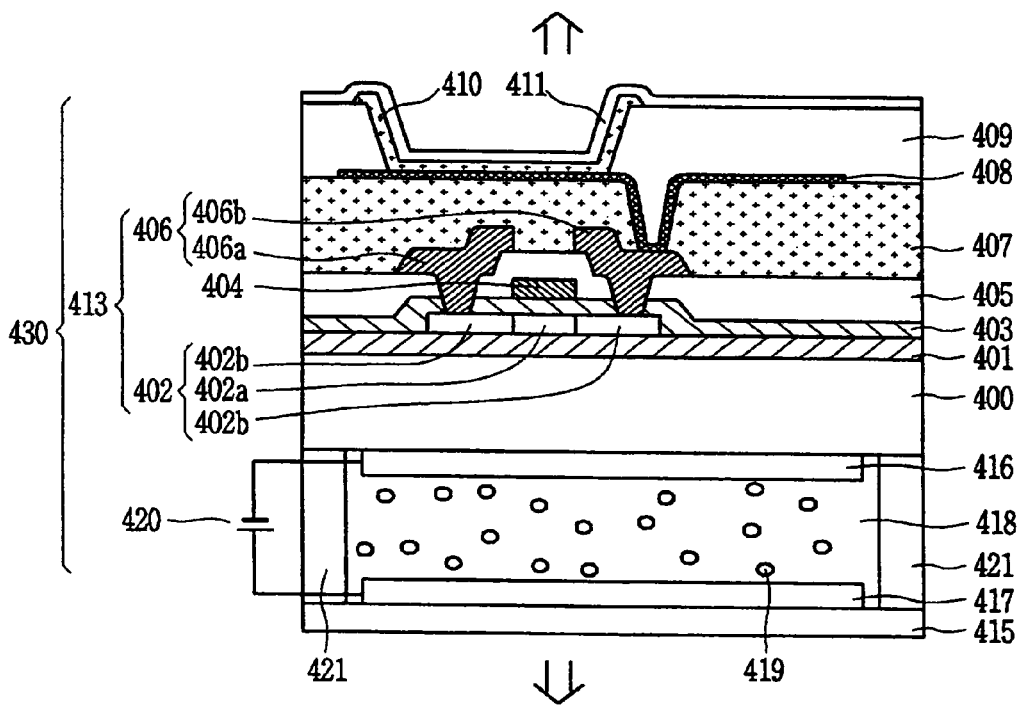
FIG. 6 is a schematic sectional view illustrating an organic light emitting display constructed as a third embodiment of the present invention.

FIG. 6 is a schematic sectional view illustrating an organic light emitting display (OLED) constructed as a third embodiment of the present invention. As shown in FIG. 6, at least one transparent TFT 413 and a structure including emission layer 410 are constructed on the upper surface of first transparent substrate 400 of OLED 430 of the present invention. Instead of the electrophoretic device as shown in FIGS. 3-5, an electrochromic device, which is a controlling unit, is formed on the lower surface of substrate 400.

Transparent thin film transistor 413 includes semiconductor layer 402, gate electrode 404, and electrode 406. Semiconductor layer 402 includes active layer 402a and ohmic contact layers 402b, and electrode 406 includes source electrode 406a and drain electrode 406b. The structure of transparent thin film transistor 413 is the same as described referring to FIG. 2, and detailed description of transparent thin film transistor 413 will be omitted.

In general, electrochromism is a phenomenon that reversibly makes electrolytic oxidizing and reducing reactions and therefore reversibly makes coloring and decoloring depending on magnitude of applied voltage. The electrochromic device, which uses the phenomenon of electrochromism, has been used as a light amount controller (for example, a mirror such as an antiglare mirror, a light control glass, etc., or a brightness controlling element such as an organic light emitting diode, etc.), a display element for numeric display using a segment, an electrochromic display, etc. The electrochromic device can mainly be divided into a solution type and a complete solid type in accordance with a type of material of an electrochromic layer constituting the electrochromic device.

In the electrochromic device formed on the lower surface of first transparent substrate 400 according to the principles of the present invention, second transparent substrate 415 are formed to face first transparent substrate 400 at a predetermined distance. Although not shown in the drawing, spacers can be formed between first transparent substrate 400 and second transparent substrate 415 to support a predetermined distance between first transparent substrate 400 and second transparent substrate 415. First transparent substrate 400 and second transparent substrate 415 can be transparent glass substrates such as quartz glass plates, white board glass plates, etc, but are not limited thereto. For example, first transparent substrate 400 and second transparent substrate 415 can be made of ester such as polyethylenenaphthalate, polyethyleneterephthalate, etc., cellulose ester such as polyamide, polycarbonate, cellulose acetate, etc., fluoropolymer such as polyvinylidene fluoride, polytetrafluoroethylenecohexafluoropropylene, etc., polyether such as polyoxymethylene, ect., polyolefin such as polyether, polyacetal, polystyrene, polyethylene, polypropylene, methylpentenepolymer, etc., or polyimide such as polyimideamide, polyetherimide, etc.

First transparent electrode 416 and second transparent electrode 417 are formed on inner surfaces of first transparent substrate 400 and second transparent substrate 415, respectively. A film of indium tin oxide (ITO), tin oxide (SnO), indium oxide (InO), zinc oxide (ZnO), or the like can be used for first transparent electrode 416 and second transparent electrode 417. First transparent electrode 416 and second transparent electrode 417 can be formed by a known method such as a deposition method, an ion plating method, a sputtering method, etc.

The electrochromic layer made of electrolyte 418 containing coloring agent 419, which is a light shielding layer, is formed between first transparent electrode 416 and second transparent electrode 417. The electrochromic layer can be configured of electrolyte obtained by dissolving, for example, cathode compound such as viologen derivative, anode compound such as metallocene(M($C_5 G_5$)$_2$), or its derivative into non-aqueous solvent.

Driving unit 420 is connected to first transparent electrode 416 and second transparent electrode 417 to apply voltage between first transparent electrode 416 and second transparent electrode 417. Driving unit 420 includes a switch (not shown), which can control the magnitude of applied voltage. A first voltage or a second voltage can be applied between first transparent electrode 416 and second transparent electrode 417 to induce different states of chemical reaction in the electrochromic layer. Detailed description of chemical reaction will be described with reference to FIGS. 7 and 8.

Further, a sealing member 421 is formed to enclose the space formed between first transparent substrate 400 and second transparent substrate 415 to prevent a leak of electrolyte 418 from the space. Sealing member 421 adheres to both of first transparent substrate 400 and second transparent substrate 415. The thickness between first transparent substrate 400 and second transparent substrate 415 is in the range of 10 μm to 100 μm.

If voltage is not applied between first transparent electrode 416 and second transparent electrode 417, electrolyte 418 containing coloring agent 419 is transparent so that light emitted from emission layer 410 transmits into both of upper and lower directions as indicated in arrows shown in FIG. 6.

Figure 7:
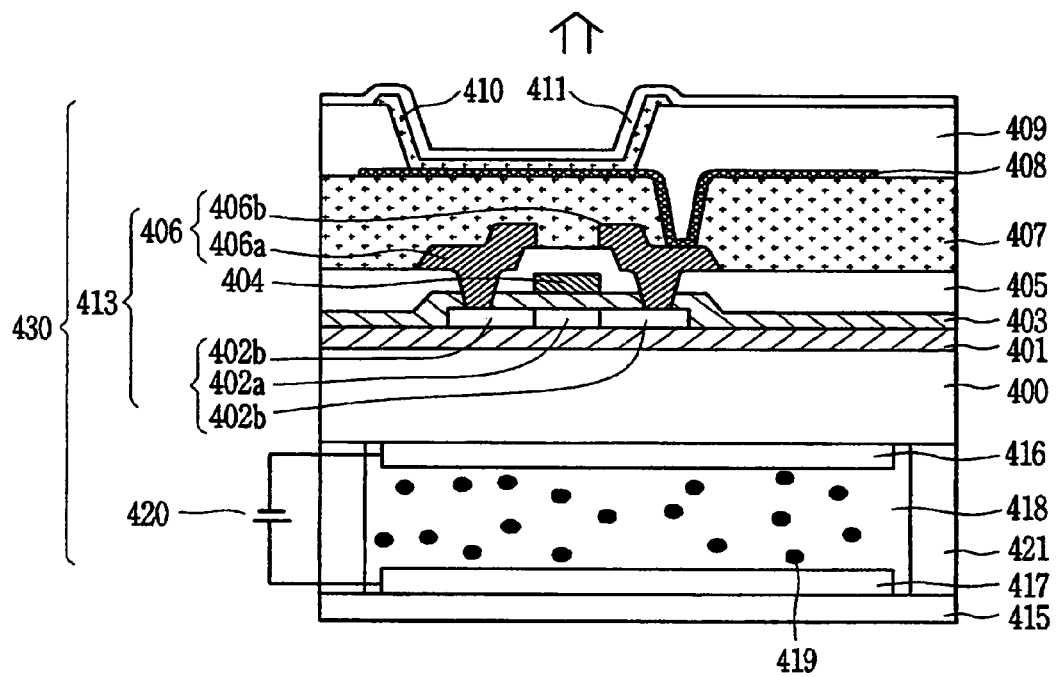
FIG. 7 is a schematic sectional view illustrating a state when a predetermined voltage is applied to the organic light emitting display of the third embodiment of the present invention.
Figure 8:
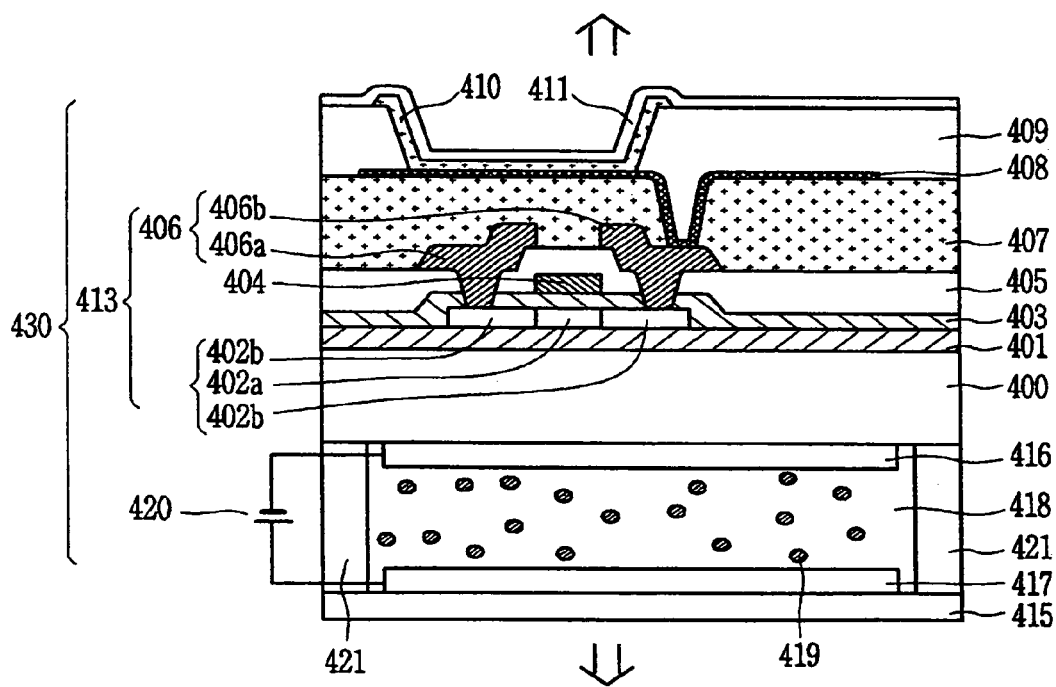
FIG. 8 is a schematic sectional view illustrating another state when voltage higher than the predetermined voltage is applied to the organic light emitting display of the third embodiment of the present invention.

FIGS. 7 and 8 are schematic sectional views illustrating a method of driving the OLED constructed as a third embodiment of the present invention. For convenience sake, detailed description of the same elements as those of FIG. 6 will be omitted. In particular, detailed description of a transparent thin film transistor and materials of the transparent thin film transistor will be omitted.

FIG. 7 is a schematic sectional view illustrating a state that a predetermined voltage is applied to the electrochromic device of organic light emitting display 430 of the third embodiment of the present invention. Referring to FIG. 7, a predetermined voltage is applied between first transparent electrode 416 and second transparent electrode 417. Electrolyte 418 containing coloring agent 419 changes its own color by oxidation and reduction reactions. Electrochromic layer, which is a coloring layer, is colored by electrochemical reaction taken place inside the electrochromic layer.

For example, reviewing compound reaction equations of viologen, reaction equation 1 is a cathode compound reaction equation of a typical viologen derivative. If there is no voltage, the viologen is a transparent state as $Bipm^{2+}$ in an original state, but if voltage is applied to the viologen, reduction reaction is generated in the electrochromic layer, and the state of the viologen is changed to into $Bipm^{+}$ state, thereby being transformed to a deep black color. Likewise, if oxidation reaction is generated in the electrochromic layer, the viologen is changed from deep black color to a transparent state. Herein, a voltage inducing oxidation can be referred to as a first voltage and another voltage inducing reduction can be referred to as a second voltage. The state induced by the first voltage can be referred to as a first state, and the state induced by the second voltage can be referred to as a second state.

[Reaction equation 1]

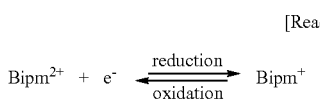

As shown in a chemical equation 1, if a predetermined voltage is applied to the viologen, the viologen reacts as shown in chemical equation 1, and the color of viologen is changed from a transparent state to a deep black. In chemical equation 1, each of $R_1$ and $R_2$ indicates phenyl group or alkyl group having 1 to 10 carbon atoms. Likewise, if oxidation reaction is generated, the viologen is changed from a deep black color to a transparent state.

[Chemical equation 1]

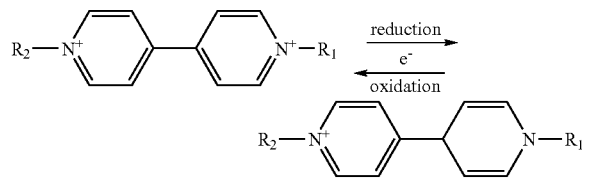

That is, if a predetermined voltage is applied between first transparent electrode 416 and second transparent electrode 417, reduction reaction is generated in the electrochromic layer, and the electrochromic layer is changed from a transparent state to a deep black state. The black state of the electrochromic layer serves as a black matrix so that light emitted from organic light emitting display 430 of the present invention is transmitted through upper direction as indicated in arrow shown in FIG. 7, and light transmission through lower direction is blocked by the black state of the electrochromic layer. When oxidation reaction is generated in the electrochromic layer, the electrochromic layer is changed from a deep black state to a transparent state so that OLED 430 of the present invention can emit light into both of upper and lower directions.

FIG. 8 is a schematic sectional view illustrating another state when another predetermined voltage is applied between first transparent electrode 416 and second transparent electrode 417 according to the principles of the third embodiment of the present invention. Referring to FIG. 8, voltage higher than the voltage that is required to transform $Bipm^{2+}$ to $Bipm^{+}$, which is described referring FIG. 7, is applied between first transparent electrode 416 and second transparent electrode 417 by controlling the switch of driving unit 420.

Reaction equation 2 is a cathode compound reaction equation of viologen derivative. When a predetermined voltage, which is described referring to FIG. 7, is applied to the viologen, the viologen is transformed to $Bipm^{+}$ state from $Bipm^{2+}$ state, and the color of viologen becomes deep black. If voltage higher than the predetermined voltage is applied to the viologen, which is in a state of $Bipm^{+}$, the color of viologen is changed again to a light black. Likewise, if oxidation reaction is generated, the viologen changes its color from a light black to a deep black.

[Reaction equation 2]

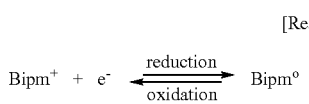

As shown in chemical equation 2, if voltage higher than the predetermined voltage is applied to the viologen, which is in a state of $Bipm^{+}$ (left side of chemical reaction 2), the viologen reacts as shown in chemical equation 2 to change its color from a deep black to a light black. In chemical equation 2, each of $R_1$ and $R_2$ indicates phenyl group or alkyl group having 1 to 10 carbon atoms. Likewise, if oxidation reaction is generated, the viologen changes its color from a light black to a deep black.

[Chemical equation 2]

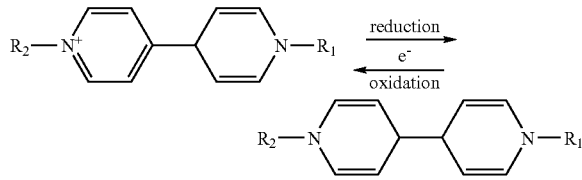

That is, if higher voltage than the predetermined voltage is applied between first transparent electrode 416 and second transparent electrode 417, reduction reaction is generated in the electrochromic layer, and the electrochromic layer changes its color from a deep black to a light black displaying gray tone. When oxidation reaction is generated in the electrochromic layer, the electrochromic layer changes its color from a light black to a deep black blocking light emission into the lower direction of organic light emitting display 430.

As another example, reaction equation 3 is an anode compound reaction equation of metallocene. In reaction equation 3, M indicates a metal.

[Reaction equation 3]

As described above, the coloring agent 419 of the electrochromic layer can include many substances such as aromatic amine, oxidation reduction complex, phtalocyanine, heterocyclic compound, fluoran, styryl, anthraquinone, or phtalicdiester, etc. Electrolyte 418 can include aqueous or non-aqueous liquid (electrolyte), semi-solid (high polymer electrolyte), etc.

In the organic light emitting display of the present invention, voltage, which is applied to the electrochromic layer, is controlled, enabling to freely display an image in the upper surface of the OLED or in both of upper and lower surfaces of the OLED.

The organic light emitting display of the present invention is further provided with an optical sensor or a voice sensor, enabling to freely display an image in the upper surface of the OLED or in both of upper and lower surfaces of the OLED, being controlled by a command carried by the optical sensor or the voice sensor.

In above-described embodiments, it is shown that the TFT is formed below an aperture of a pixel defining layer overlapping with the aperture, but the TFT can be formed on the other location that is not overlapped with the aperture. Also, in the above-described embodiments, a coplanar TFT has been described, but the present invention can be applied to other structure of TFT such as a reverse coplanar structure, a staggered structure, or a reverse staggered structure.

Although the preferred embodiments of the present invention have been disclosed for illustrative purposes, those skilled in the art will appreciate that various modifications, additions, and substitutions are possible, without departing from the scope and spirit of the invention as disclosed in the accompanying claims.

As described above, the present invention relates to a flat panel display and an organic light emitting display, which displays an image in an upper surface of the organic light emitting display for a predetermined time period set by a user and displays an image in both of an upper and a lower surfaces of the organic light emitting display when the predetermined time period is not set. The selection of the surface, in which an image is displayed, is controlled by an opaque state or a transparent state of a controlling unit included in the organic light emitting display.

What is claimed is:
1. An organic light emitting display comprising:
a first transparent substrate;
an emission layer arranged above an upper surface of the first transparent substrate;
a transparent thin film transistor arranged on the upper surface of the first transparent substrate for driving the emission layer;
a first transparent electrode arranged on a lower surface of the first transparent substrate;
a second transparent substrate arranged below the lower surface of the first transparent electrode;
a light shielding layer arranged between the first transparent electrode and the second transparent substrate; and
a side electrode arranged on a side of the light shielding layer.

2. The organic light emitting display as claimed in claim 1, wherein the light shielding layer is capable of being switched to a first state whenever a first voltage is applied to the first transparent electrode and capable of being switched to a second state whenever a second voltage is applied to the first transparent electrode, an amount of light passing the light shielding layer at the first state is different from an amount of light passing the light shielding layer at the second state.

3. The organic light emitting display as claimed in claim 1, further comprising:
a second transparent electrode arranged between the light shielding layer and the second transparent substrate.

4. The organic light emitting display as claimed in claim 3, wherein the light shielding layer is formed of one selected from the group consisting of a polymer dispersed liquid crystal, twisted nematic liquid crystal layer, and an electrochromic layer.

5. The organic light emitting display as claimed in claim 1, wherein the light shielding layer is formed of an electrophoretic layer.

6. The organic light emitting display as claimed in claim 5, further comprising:
a second transparent electrode arranged between the light shielding layer and the second transparent substrate.

7. The organic light emitting display as claimed in claim 6, wherein voltages with the same polarity are applied to the first and the second electrodes.

8. The organic light emitting display as claimed in claim 1, further comprising a driving unit for applying a voltage to the first transparent electrode layer.

9. The organic light emitting display as claimed in claim 8, wherein the driving unit is manually controlled or automatically controlled by a photosensing.

10. The organic light emitting display as claimed in claim 1, wherein the transparent thin film transistor includes a transparent semiconductor layer, a transparent gate electrode, a transparent source electrode, and a transparent drain electrode.

11. The organic light emitting display as claimed in claim 10, wherein each of the transparent electrode, the transparent source electrode, and the transparent drain electrode is made of one selected from the group consisting of indium tin oxide (ITO), indium zinc oxide (IZO), and indium tin zinc oxide (ITZO).

12. The organic light emitting display as claimed in claim 10, wherein the transparent semiconductor layer included in the transparent thin film transistor is formed of a wide band semiconductor substance whose band gap is at least 3.0 eV.

13. The organic light emitting display as claimed in claim 12, wherein the wide band semiconductor substances are formed of one selected from the group consisting of zinc oxide (ZnO), zinc tin oxide (ZnSnO), cadmium tin oxide (CdSnO), gallium tin oxide (GaSnO), thallium tin oxide (TlSnO), indium gallium zinc oxide (InGaZnO), copper aluminum oxide (CuAlO), strontium copper oxide (SrCuO), layered oxychalcogenide (LaCuOS), gallium nitride (GaN), indium gallium nitride (InGaN), aluminum gallium nitride (AlGaN), indium gallium aluminum nitride (InGaAlN), silicon carbide (SiC), and diamond.

14. An organic light emitting display comprising:
a first transparent substrate;
a transparent thin film transistor formed on an upper surface of the first transparent substrate;

an emission layer formed on the top of the transparent thin film transistor that drives the emission layer;

a first transparent electrode arranged on a lower surface of the first transparent substrate;

a second transparent substrate arranged below the first transparent electrode;

a light shielding layer arranged between the first transparent electrode and the second transparent substrate; and a side electrode arranged on a side of the light shielding layer.

15. The organic light emitting display as claimed in claim 14, further comprising:

a second transparent electrode arranged between the light shielding layer and the second transparent substrate.

16. The organic light emitting display as claimed in claim 14, wherein the transparent thin film transistor includes a transparent semiconductor layer, a transparent gate electrode, a transparent source electrode, and a transparent drain electrode.

* * * * *